United States Patent [19]

Mischenko

[11] Patent Number: 4,746,242

[45] Date of Patent: May 24, 1988

[54] FLEX-LOCK DOVETAIL MOUNTING APPARATUS FOR RADIO TRANSCEIVERS AND ACCESSORIES

[75] Inventor: Nicholas Mischenko, Mt. Prospect, Ill.

[73] Assignee: Motorola, Inc., Schaumburg, Ill.

[21] Appl. No.: 28,859

[22] Filed: Mar. 23, 1987

Related U.S. Application Data

[62] Division of Ser. No. 858,427, May 1, 1986, Pat. No. 4,681,476.

[51] Int. Cl.⁴ ............................................. F16B 2/14
[52] U.S. Cl. .................................... 403/373; 403/381
[58] Field of Search ................ 403/381, 373, 331, 13, 403/14, 374

[56] References Cited

U.S. PATENT DOCUMENTS

| | | | |
|---|---|---|---|
| 2,320,776 | 6/1943 | Gorton | 403/381 X |
| 2,579,011 | 12/1951 | Pieper | 403/381 X |
| 3,228,335 | 1/1966 | Thompson | 403/373 X |
| 3,913,192 | 10/1975 | Bäumer et al. | 403/381 |
| 4,090,796 | 5/1978 | Okuda et al. | 403/381 X |
| 4,300,271 | 11/1981 | Wohlhaupter | 403/373 X |
| 4,461,594 | 7/1984 | Waber | 403/381 X |

FOREIGN PATENT DOCUMENTS

2258775 8/1975 France ................... 403/381

*Primary Examiner*—Randolph A. Reese
*Assistant Examiner*—Peter M. Cuomo
*Attorney, Agent, or Firm*—Rolland R. Hackbart

[57] ABSTRACT

Unique flex-lock dovetail mounting apparatus (300) is described that may be advantageously utilized for mounting radio transceivers (100) and accessories (200) in harsh environments. The housing of the radio transceiver (100) includes on one side thereof at least two channels (101 and 105) producing a dovetail. The mounting apparatus (300) includes a top plate (304); a slide plate (308) attached to the top plate (304), having on at least one end a cut-out portion (310) producing a gap (320, 321 and 322) between the cut-out portion (310) and the top plate (304), and having at least two rails (301 and 305) producing a dovetail and each adapted to insert into a corresponding one of the channels (101 and 105); and locking apparatus including a lever (306) or a thumb screw (706) coupled to the top plate (304) and the cut-out portion (310) of the slide plate (308) for flexing the cut-out portion (310) toward the top plate (304) thereby locking the rails (301 and 305) in position in the channels (101 and 105).

4 Claims, 4 Drawing Sheets

4,746,242

FLEX-LOCK DOVETAIL MOUNTING APPARATUS FOR RADIO TRANSCEIVERS AND ACCESSORIES

This is a division of application Ser. No. 858,427, filed May 1, 1986 and now U.S. Pat. No. 4,681,476.

BACKGROUND OF THE INVENTION

The present invention is generally related to radio transceivers and more particularly to improved flex-lock dovetail mounting apparatus for radio transceivers and accessories.

In the prior art, radio transceivers and accessories were typically separately mounted in a vehicle, such as, for example, the radio transceiver being mounted in the trunk using a mounting tray attached to the floor and the accessory being mounted in the vehicle using a mounting bracket attached to the dashboard or floor. As a result, long cables were required both between the radio transceiver and the accessory and between the radio transceiver and the vehicle battery. These prior mounting approaches are not only costly in both required materials and installation time, but also inflexible and restrictive as to possible positioning and location of the radio transceiver and accessories.

SUMMARY OF THE INVENTION

Accordingly, it an object of the present invention to provide improved flex-lock dovetail mounting apparatus that allows for easy installation and removal of a radio transceiver and its accessories.

Briefly described, the present invention encompasses improved dovetail mounting apparatus for retaining a housing having on one side thereof at least two channels producing a dovetail. The improved dovetail mounting apparatus comprises: a base plate having a flat portion on a first end thereof and a channelled portion formed by first and second raised sides and a second end thereof; a first slide plate attached to said channelled portion of said base plate and having at least two rails for inserting into corresponding ones of said channels of said housing; a second slide plate attached to said channelled portion of said base plate and having at least two rails producing a dovetail, each rail of said second slide plate being substantially aligned with a corresponding one of said rails of said first slide plate for inserting into a corresponding one of said channels of said housing; a spring device attached to said second slide plate for forcing said channels away from said rails of said second slide plate thereby producing friction between said rails of said second slide plate and said channels of said housing; and a locking device coupled to said flat portion of said base plate for locking said housing in said channelled portion of said base plate.

DESCRIPTION OF THE PREFERRED EMBODIMENT

Figure 1:
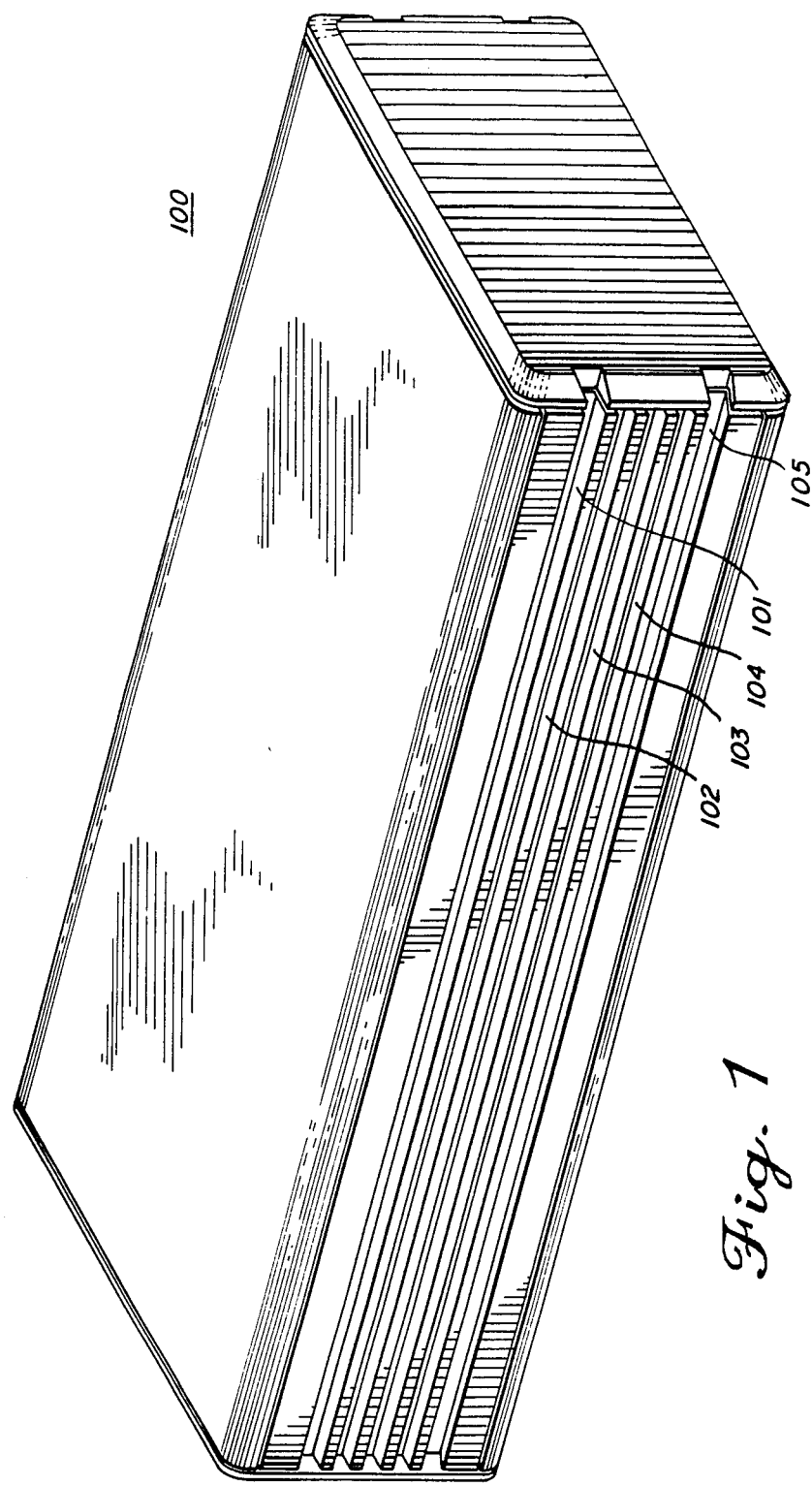
FIG. 1 is a perspective view of a radio transceiver used in practicing the present invention.

In FIG. 1, there is illustrated a perspective view of radio transceiver 100 used in practicing the present invention. The front and back sides of radio transceiver 100 each include five channels 101–105, of which two channels 101 and 105 produce a dovetail. Radio transceiver also includes a radio frequency transmitter, RF receiver and microcomputer control circuitry, which when used with a handset of the type shown in U.S. Pat. No. D271,491 operates as a cellular radiotelephone. Radio transceiver 100 and its associated handset may include circuitry of the type illustrated and described in Motorola Instruction Manual No. 68P81049E55, entitled DYNATAC Cellular Mobile Telephone and published in 1983. This and other Motorola Instruction Manuals are available from the International Parts Department of Motorola, Inc., 1313 East Algonquin Road, Schaumburg, Ill. 60196, U.S.A.

Figure 2:
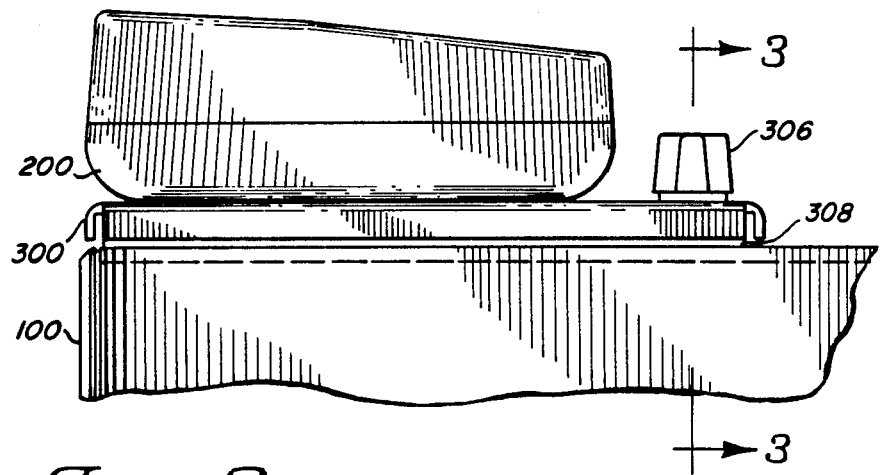
FIG. 2 is a bottom side view of the radio transceiver of FIG. 1 together with a hang-up cup and the preferred embodiment of mounting apparatus embodying the present invention.

Referring next to FIG. 2, there is illustrated a bottom side view of radio transceiver 100 together with a hang-up cup 200 and the preferred embodiment of mounting apparatus 300 embodying the present invention. Hang-up cup 200 may be similar to the handset receptacle shown in U.S. Pat. No. D276,809. Hang-up cup 200 retains the handset (not shown) associated with radio transceiver 100. The handset associated with radio transceiver 100 may be similar to the handset shown in U.S. Pat. No. D271,491. Hang-up cup 200 may be attached by screws, rivets, glue or other appropriate means to mounting apparatus 300. Mounting apparatus 300 includes a lever 306, shown in the locked position in FIG. 2, which may be turned 180° to allow mounting apparatus 300 to slide in channels 101 and 105 for repositioning hang-up cup 200. Once hang-up cup 200 is in the desired position, lever 306 is turned 180° to lock mounting apparatus 300 and hang-up cup 200 in that desired position.

Figure 3:
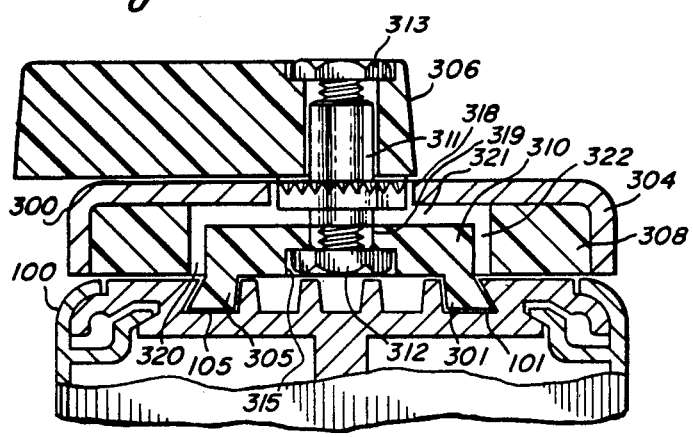
FIGS. 3 is a partial cross-sectional view taken along lines 3—3 in FIG. 2, illustrating the unlocked state of the mounting apparatus.
Figure 4:
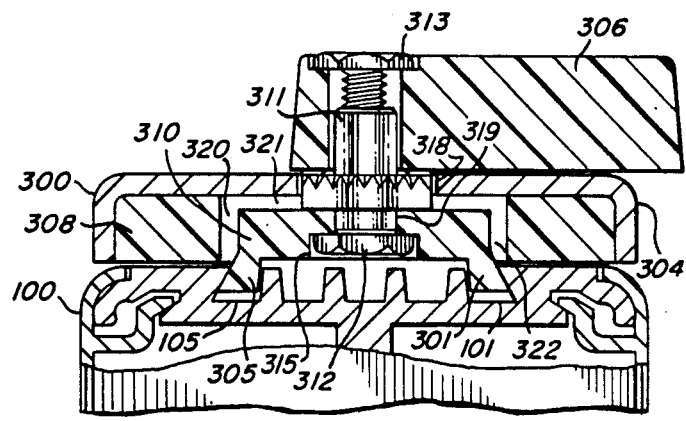
FIG. 4 is another partial cross-sectional view taken along lines 3—3 in FIG. 2, illustrating the locked state of the mounting apparatus.

In FIGS. 3 and 4, there is illustrated two partial cross-sectional views taken along lines 3—3 in FIG. 2. In FIG. 3, lever 306 is in the unlocked position so that mounting apparatus 300 slides freely in channels 101 and 105, and in FIG. 4, lever 306 is in the locked position so that mounting apparatus 300 is locked in channels 101 and 105. Mounting apparatus 300 includes top plate 304, slide plate 308 and locking apparatus including lever 306, bushing 311, slotted screw 313 and hex-head screw 312. Bushing 311 has a serrated top surface and a threaded hole for accepting screws 312 and 313. Lever 306 has a correspondingly serrated surface which mates with the serrated surface of bushing 311. Lever 306 is mated with bushing 311 and held in position with slotted screw 313. Lever 306 can be repositioned by removing screw 313 in order that mounting apparatus 300 may be locked and unlocked by turning lever 180°.

Referring to FIGS. 3 and 4, top plate 304 is preferably comprised of metal and may be attached to slide plate 308 by screws, rivets, glue or other appropriate means. In the preferred embodiment, top plate 304 is attached to slide plate 308 by lever 306, bushing 311 and screws 312 and 313 (which are disposed in a hole 318 in top plate 304 and a hole 319 in slide plate 308); and top plate 304 and slide plate 308 together are attached to hang-up cup 200 by screws. Slide plate 308, preferably comprised of Noryl N300 plastic, has a cavity 315 (see FIG. 5) shaped to accept and prevent rotation of screw 312. Other suitable materials such as Nylon or other plastics may be used for slide plate 308. Slide plate 308 also includes on each end a cut-out portion 310 occupying approximately one-third of slide plate 308 and extending from the end toward the middle of slide plate 308, as can be seen more clearly in FIG. 5. Gaps 320, 321 and 322 in FIG. 5 surround cut-out portion 310 of slide plate 308. Slide plate 308 further includes two rails 301 and 305 producing a dovetail which mates with the dovetail produced by channels 101 and 105, respectively. Although rails 301 and 305 and channels 101 and 105 each have only one flared edge, both edges may be flared such that each rail 301 and 305 and each channel 101 and 105 produces a dovetail.

According to an important feature of the present invention, turning lever 306 causes cut-out portion 310 to flex upward creating friction between rails 301 and 305 and channels 101 and 105, respectively, for locking mounting apparatus 300 in place. Since cut-out portion 310 flexes, the resultant security of the lock achieved is greatly enhanced. At the same time, lever 306, top plate 304 and slide plate 308 apply force along the bottom of slide plate 308 against the side of radio transceiver 100. Thus, mounting apparatus 300 in FIG. 2 may be randomly positioned along the channels 101 and 105 of radio transceiver 100 and securely locked in place simply by turning lever 306.

Figure 5:
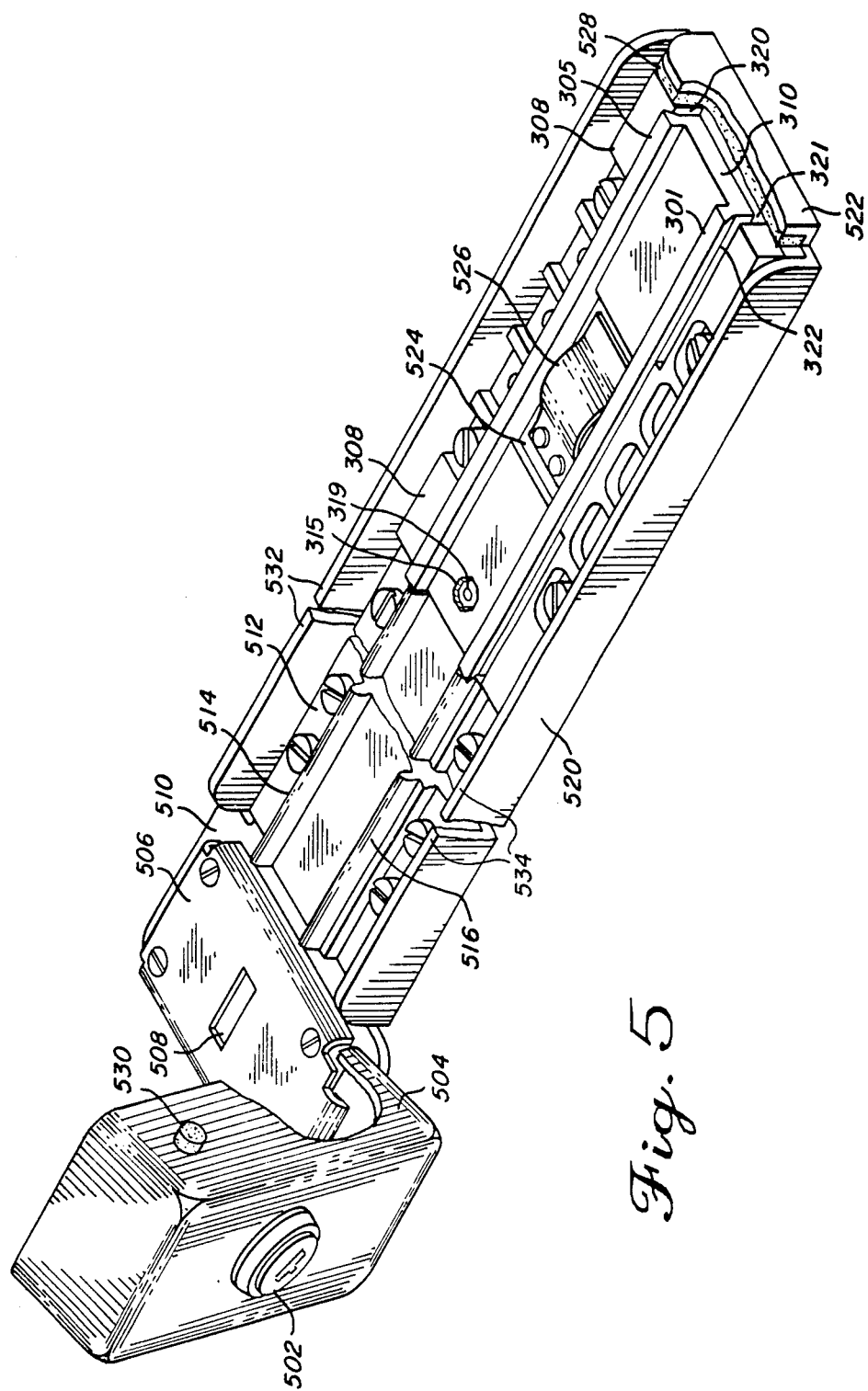
FIG. 5 is a perspective view of novel mounting apparatus for retaining and locking the radio transceiver in FIG. 1.

Referring now to FIG. 5, there is illustrated a perspective view of novel mounting apparatus for retaining and locking the radio transceiver in FIG. 1. The mounting apparatus of FIG. 5 includes a base plate 520 having a lock plate 506, lock cover 504 and lock 502 mounted on end 510 of base plate 520 and having slide plates 512 and 308 mounted in a channel formed by the raised sides 532 and 534 and end 522 of base plate 520. Lock plate 506 has a slot 508 for accepting the tang of lock 502. Lock cover 504 is attached to and rotatably hinged from lock plate 506.

Slide plate 512 in FIG. 5 includes two rails 514 and 516 which insert into channels 105 and 101, respectively, of transceiver 100. Slide plate 512 is preferably comprised of Nylon, and slide plate 308 is preferably comprised of Noryl N300 plastic. Rails 514 and 516 of slide plate 512 align with rails 305 and 301, respectively, of slide plate 308. Gaps 320, 321 and 322 surround cut-out portion 310 of slide plate 308. Slide plate 308 also includes cut-out portion 524 in which spring 526 is mounted. Spring 526 or an equivalent means may also be disposed on one or both of the edges of slide plate 308. Transceiver 100 is guided by rails 512 and 516 to rails 305 and 301. As transceiver 100 slides on rails 301 and 305, spring 526 is engaged and causes friction between rails 301 and 305 and channels 101 and 105 of transceiver 100. When transceiver 100 is fully inserted, lock cover 504 may be pivoted shut and lock 502 may be locked with a key. To prevent transceiver 100 from rattling and being scratched, a pad 528 is positioned between transceiver 100 and end 522 and two bumpers 530 are positioned between transceiver 100 and lock cover 504.

Figure 6:
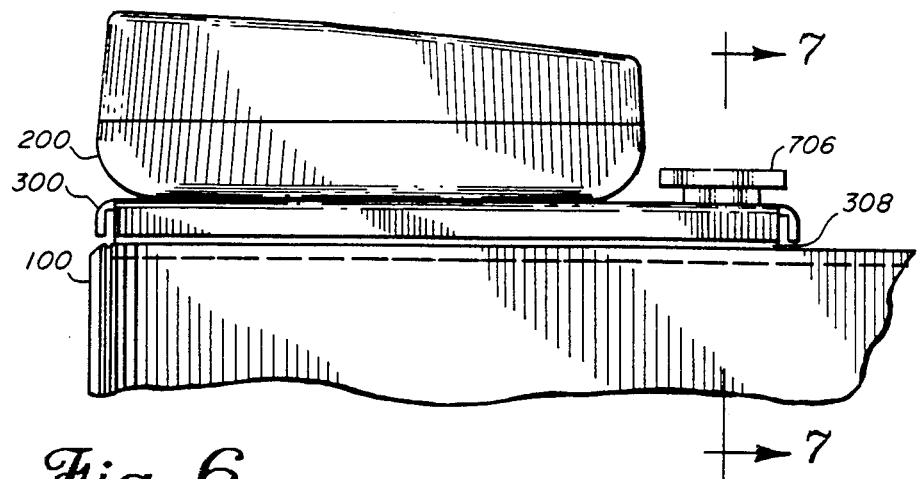
FIG. 6 is a bottom side view of the radio transceiver of FIG. 1 together with a hang-up cup and another embodiment of mounting apparatus embodying the present invention.

Referring next to FIG. 6, there is illustrated a bottom side view of the radio transceiver 100 together with a hang-up cup 200 and another embodiment of mounting apparatus 300 embodying the present invention. In the embodiment in FIG. 6, mounting apparatus 300 includes a thumb screw 706 which may be loosened to allow mounting apparatus 300 to slide in channels 101 and 105 for repositioning hang-up cup 200. Once hang-up cup 200 is in the desired position, thumb screw 706 is tightened to lock mounting apparatus 300 and hang-up cup 200 in that desired position. Except for thumb screw 706, all other items in FIGS. 6, 7 and 8 have the same reference numerals as corresponding items in FIGS. 2, 3 and 4.

Figure 7:
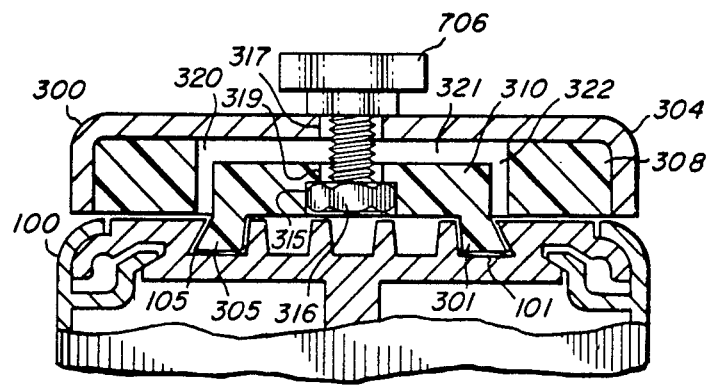
FIG. 7 is a partial cross-sectional view taken along lines 7—7 in FIG. 6, illustrating the unlocked state of the mounting apparatus.
Figure 8:
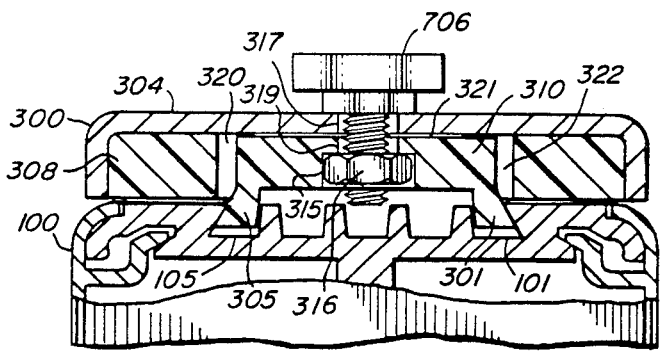
FIG. 8 is another partial cross-sectional view taken along lines 7—7 in FIG. 6, illustrating the locked state of the mounting apparatus.

In FIGS. 7 and 8, there is illustrated two partial cross-sectional views taken along lines 7—7 in FIG. 6. In FIG. 7, thumb screw 706 is loosened so that mounting apparatus 300 slides freely in channels 101 and 105, and in FIG. 8, thumb screw 706 is tightened so that mounting apparatus 300 is locked in channels 101 and 105. In this embodiment of mounting apparatus 300, top plate 304 is attached to slide plate 308 by thumb screw 706 (which is disposed in a hole 317 in top plate 304 and hole 319 in slide plate 308) and nut 312. Slide plate 308 has a cavity 315 (see FIG. 5) shaped to accept and prevent rotation of nut 316.

According to an important feature of the present invention, tightening thumb screw 706 causes cut-out portion 310 to flex upward creating friction between rails 301 and 305 and channels 101 and 105, respectively, for locking mounting apparatus 300 in place. Since cut-out portion 310 flexes, the resultant security of the lock achieved is greatly enhanced. At the same time, thumb screw 706, top plate 304 and slide plate 308 apply force along the bottom of slide plate 308 against the side of radio transceiver 100. Thus, mounting apparatus 300 in FIG. 6 may be randomly positioned along the channels 101 and 105 of radio transceiver 100 and securely locked in place simply by tightening thumb screw 706.

In summary, unique flex-lock dovetail mounting apparatus has been described that may be advantageously utilized in mounting radio transceivers and accessories. The slide plate of the unique mounting apparatus flexes to produce friction between the rails of the slide plate and the channels in the radio transceiver. The unique flex-lock dovetail mounting apparatus of the present invention may be advantageously utilized in a variety of applications for mounting inter-related apparatus in harsh environments.

What is claimed is:

1. Improved dovetail mounting apparatus for retaining a housing having on one side thereof at least two channels producing a dovetail, comprising:
   a base plate having a flat portion on a first end thereof and a channelled portion formed by first and second raised sides and a second end thereof;
   a first slide plate attached to said channelled portion of said base plate and having at least two rails for inserting into corresponding ones of said channels of said housing;

a second slide plate attached to said channelled portion of said base plate and having at least two rails producing a dovetail, each rail of said second slide plate being substantially aligned with a corresponding one of said rails of said first slide plate for inserting into a corresponding one of said channels of said housing;

means attached to said second slide plate for forcing said channels away from said rails of said second slide plate thereby producing friction between said rails of said second slide plate and said channels of said housing; and means coupled to said flat portion of said base plate for locking said housing in said channelled portion of said base plate.

2. The improved dovetail mounting apparatus according to claim 1, wherein said second slide plate has at one end a cut-out portion producing a gap between said cut-out portion and said base plate, said cut-out portion including said two rails of said second slide plate.

3. The improved dovetail mounting apparatus according to claim 1, wherein said locking means includes a lock, a lock plate having a slot and being attached to said base plate and a lock cover attached to and rotatably hinged from said lock plate for enclosing said lock.

4. The improved dovetail mounting apparatus according to claim 1, wherein said forcing means comprises a spring attached to said base plate.

* * * * *